United States Patent [19]

Allen et al.

[11] 4,285,759
[45] Aug. 25, 1981

[54] APPARATUS FOR STRIPPING A COVER SHEET

[75] Inventors: Richard B. Allen, Waterbury, Conn.; Thomas E. Patten, South Amboy, N.J.

[73] Assignee: E. I. Du Pont de Nemours and Company, Wilmington, Del.

[21] Appl. No.: 95,300

[22] Filed: Nov. 19, 1979

[51] Int. Cl.$^3$ ............................................. B32B 31/16
[52] U.S. Cl. ..................................... 156/584; 156/344; 226/5; 226/96; 271/310; 271/DIG. 2; 414/20; 430/259
[58] Field of Search ............... 156/344, 584; 226/5, 226/93, 96; 271/174, DIG. 2; 414/14, 20; 430/259

[56] References Cited

U.S. PATENT DOCUMENTS

| | | | |
|---|---|---|---|
| 3,266,797 | 8/1966 | Stievenart | 271/64 |
| 3,282,765 | 11/1966 | Pine et al. | 156/344 |
| 3,346,159 | 10/1967 | Winkler | 414/20 X |
| 3,404,057 | 10/1968 | Heiart | 156/522 |
| 3,451,872 | 6/1969 | Townsend | 156/254 |
| 3,477,896 | 11/1969 | Townsend et al. | 156/584 |
| 3,547,730 | 12/1970 | Cohen | 156/345 |
| 3,562,075 | 2/1971 | Wyeth | 156/584 |
| 3,649,416 | 3/1972 | Chapman et al. | 156/523 |
| 3,682,744 | 8/1972 | Person | 156/389 |
| 3,687,552 | 8/1972 | Almond et al. | 355/113 |
| 3,727,815 | 4/1973 | Schwartz | 156/584 X |
| 3,771,871 | 11/1973 | Rattman | 355/102 |
| 3,794,546 | 2/1974 | Cohen et al. | 156/344 |
| 3,883,390 | 5/1975 | Cohen et al. | 156/584 |
| 3,996,127 | 12/1976 | Rautimo et al. | 156/584 X |
| 4,019,821 | 4/1977 | Sandner | 401/4 |
| 4,069,791 | 1/1978 | Tobias | 118/120 |
| 4,183,751 | 1/1980 | Matsumoto et al. | 156/584 X |

FOREIGN PATENT DOCUMENTS

| | | |
|---|---|---|
| 747882 | 12/1966 | Canada . |
| 48-11579 | 4/1973 | Japan . |
| 942579 | 11/1963 | United Kingdom . |
| 1018175 | 1/1966 | United Kingdom . |

OTHER PUBLICATIONS

Du Pont, Inc., "Printing Systems" Brochure, May, 1978 (3PP.).
Du Pont, Inc., "Chromalin ® Film Proofing System", Brochure May, 1974 (3PP.).
"Int'l. Symposium on Advances in Photopolymer Systems", S.P.S.E., Nov. 14-17, 1978, (pp. i-ii, vi, xvi, 146-149).

Primary Examiner—David A. Simmons
Assistant Examiner—Robert A. Dawson

[57] ABSTRACT

An apparatus for stripping an adherent cover sheet from a photosensitive film sandwich. A leader from a roll extends over a film having a cover sheet and is attached to an edge of the cover sheet. When the roll is driven, the leader wraps on it and strips the cover sheet from the film which had previously been fixed in a stationary position.

6 Claims, 6 Drawing Figures

APPARATUS FOR STRIPPING A COVER SHEET

DESCRIPTION

1. Technical Field

This invention relates generally to the production of color proofs and, more particularly, to the removal of a cover sheet from the image-defining, tacky surface of an exposed film so that a toner can be applied.

2. Background

Films having a photopolymerizable layer coated on a base and a clear, plastic, cover sheet are known and used in the graphic arts. After imagewise exposure of the film, the cover sheet has been removed manually. The surface of the photopolymerized layer has a latent image defined by different degrees of tackiness in exposed and unexposed areas and that latent image is developed with a particulate toner. Difficulties have been experienced, especially with large films, in stripping the cover sheet without damaging or marring the photopolymerized surface. Since image quality is dependent on peel, a stripping machine is needed which will give a constant peel rate and overcome the possible high resistance of large proofs.

DISCLOSURE OF THE INVENTION

Cover sheets have been removed with an even, steady pull at a low angle of peel in an apparatus that includes a support having a top surface on which a photosensitive film sandwich can be fixed. An elongated stripping roll is mounted for rotation about an axis parallel to the top surface and has one end of a leader attached to it. The leader is in the form of a flexible sheet, the opposite end of which is attached to an edge of a cover sheet that is remote from the roll. When the roll is rotated, the leader is wrapped on it, exerts a steady pull and strips the cover sheet from a film sandwich affixed to the support surface.

DESCRIPTION OF DRAWINGS

A preferred embodiment has been illustrated in the accompanying drawings, wherein:

FIGS. 5 and 6 are sectional views taken on lines V—V and VI—VI, respectively, in FIG. 3.

DESCRIPTION OF APPARATUS

Figure 1:
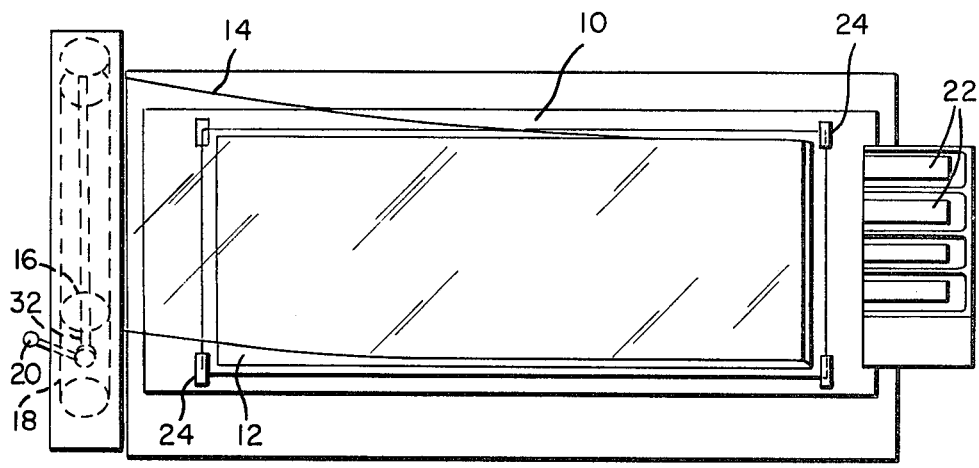
FIG. 1 is a schematic of the apparatus and its association with a toning console.

The toning console shown in FIG. 1 includes a table having a top surface 10 on which a film 12 is fixed in preparation for removal of a protective cover sheet. An edge of the cover sheet is peeled back and attached to the free end of a leader 14. Leader 14 is an elongated sheet of plastic having its other end attached to a roll 16. With leader 14 attached to the cover sheet on film 12, roll 16 is brought into engagement with a drive roll 18 by movement of a lever 20. After the cover sheet has been removed, a toner of the desired color is applied to the image-defining surface either with one of the devices shown at 22 or by removing the proof and advancing it through an automatic toning apparatus of the type disclosed in U.S. Pat. No. 4,069,791 to Tobias. There is a detailed disclosure of the devices 22 in U.S. Pat. No. 4,019,821 to Sandner.

Figure 2:
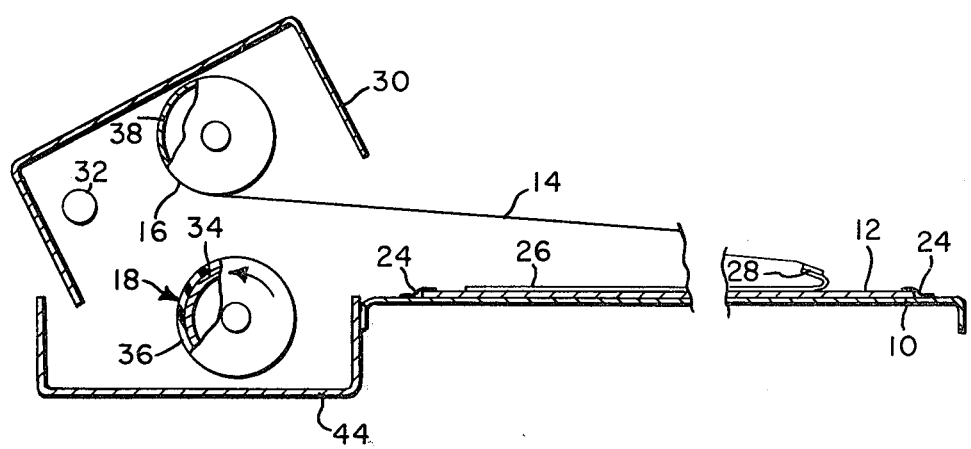
FIG. 2 is a schematic of the manner in which a film can be fixed to a toning table and a leader to the edge of a cover sheet.

In FIG. 2, film 12 has been shown fixed to the support, table top 10, by adhesive strips 24. Similarly, the end of leader 14 has been fastened to the peeled back edge of a cover sheet 26 by double sided adhesive strips 28. Roll 16 is rotatably mounted in the ends of its housing 30 and the housing is mounted on a shaft 32 that is coupled to lever 20. Drive roll 18 was fabricated from relatively thick, steel tubing 34 and end plugs. An elastomeric tube 36 was cemented onto tubing 34. Stripping roll 16 was fabricated from thinwall, aluminum tubing 38 and end plugs.

Figure 3:
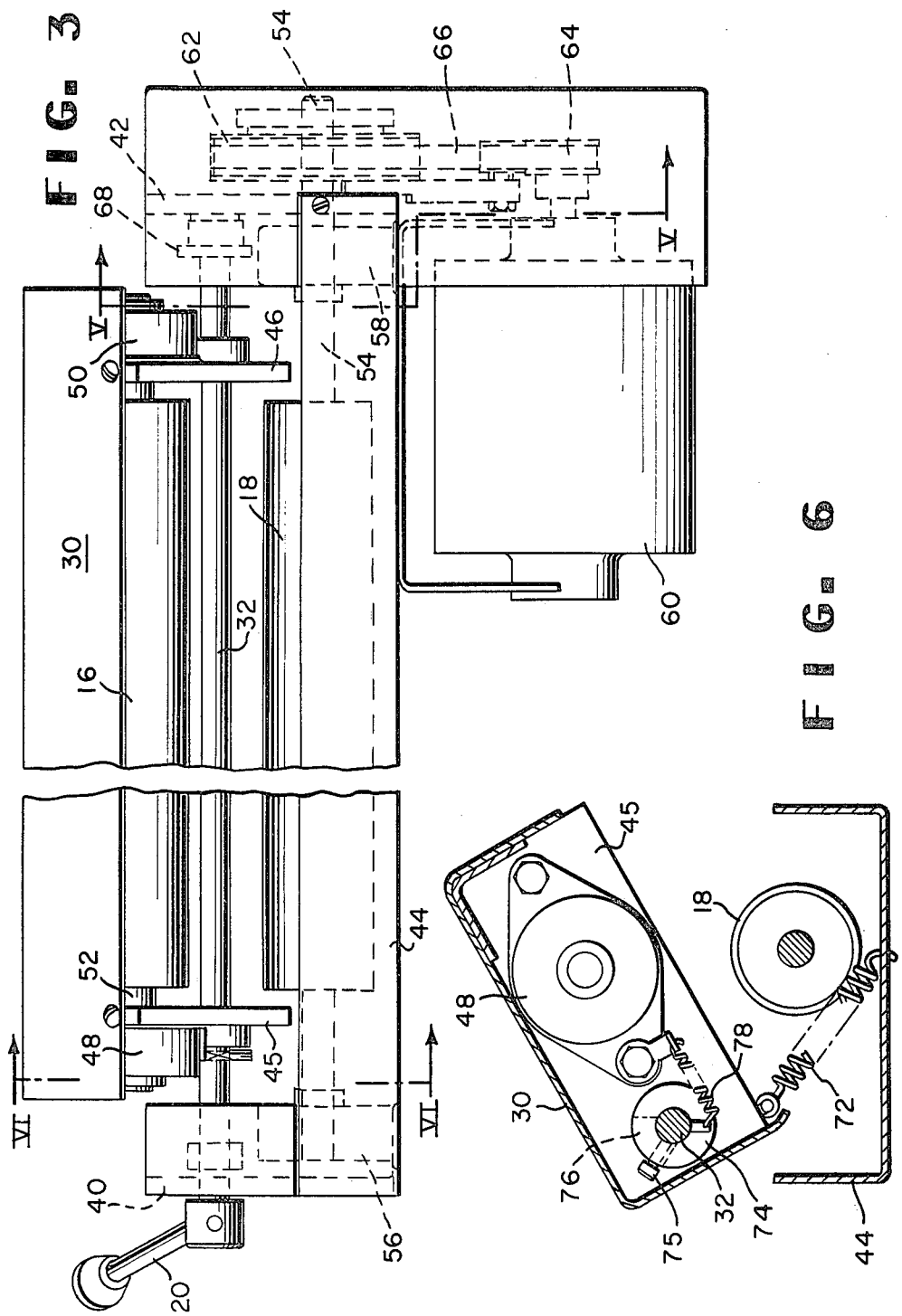
FIG. 3 is a fragmentary, front view of the apparatus.
Figure 4:
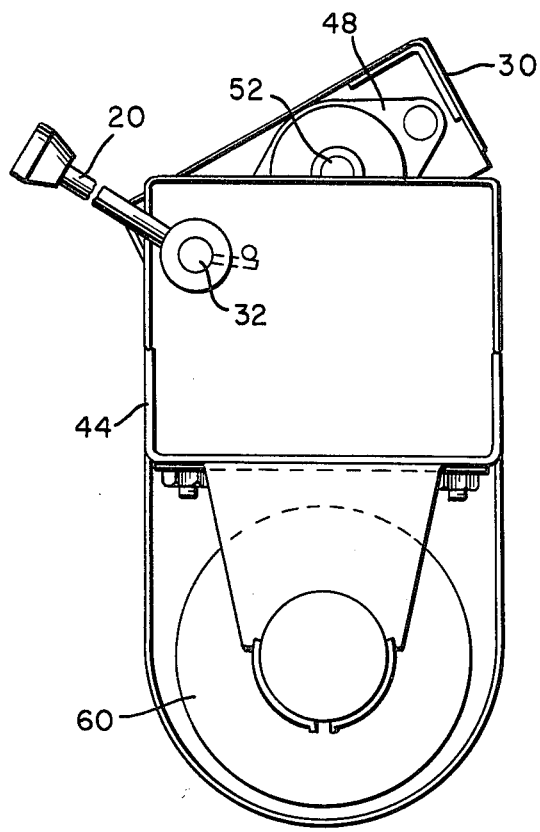
FIG. 4 is an end view.

Referring to FIGS. 3 and 4, shaft 32 is journalled in end plates 40,42 that are affixed to a housing 44 for the drive roll 18. Housing 44 is the main frame of the apparatus and is, in turn, attached to the frame of the toning console. Shaft 32 also extends through plates 45,46 in housing 30 and plates 45,46 carry flanged bearings 48,50 for shaft 52 of roll 16. Roll 18 has a shaft 54 mounted in bearings 56,58. Shaft 54 is coupled to a motor 60 by pulleys 62,64 and a belt 66.

Figure 5:
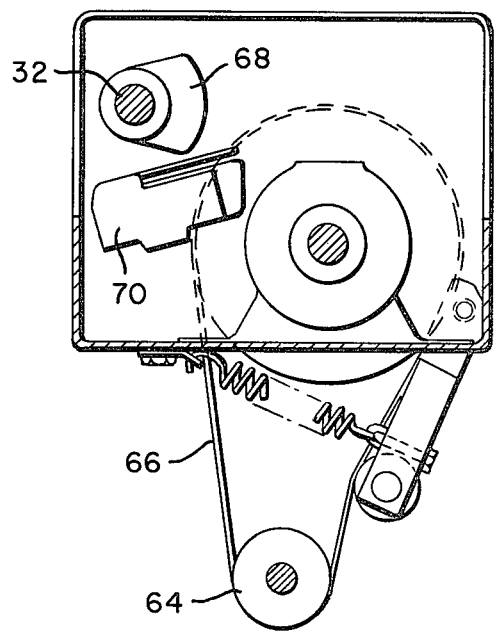

As shown in FIGS. 3 and 5, shaft 32 carries a cam 68 which, when lever 20 is moved to the right (FIGS. 1 and 4), engages the arm of a switch 70 in the circuit of motor 60. The motor is activated early in the motion of lever 20, before the nip is closed between rolls 16,18. As shown in FIG. 6, housing 30 is biased to a normally open position by a spring 72. Shaft 32 is coupled to housing 30 by a lost motion device that includes a ring 74 fastened to plate 45. Ring 74 has a radial slot 76. A screw 75 fastened to shaft 32 is slidable in slot 76. Ring 74 and housing 30 are normally held in the position shown in FIG. 6 by a spring 78.

The apparatus is particularly useful in the preparation of proofs prepared from CROMALIN ® photopolymer proofing film for toning, after such film has been exposed to actinic rays through a transparency. When an edge of the cover sheet has been peeled back, the film is affixed to table top 10 with the peeled back edge remote from roll 16. Then, leader 14 is attached to the peeled edge and lever 20 is moved. In the first movement of lever 20, shaft 32 moves relatively with respect to housing 30 until stop screw 75 abuts the other end of slot 76. During this lost motion, cam 68 engages the arm of switch 70 and activates motor 60. Further movement of lever 20 swings housing 30 and roll 16 toward roll 18. By the time roll 16 reaches drive roll 18, the latter is up to speed and an even, steady tension is applied to leader 14 and thereby to cover sheet 26. Because of its mass, roll 18 acts as a fly wheel to maintain constant speed as the cover sheet is stripped. The relatively low weight of roll 16 permits nearly instant acceleration. Because of the low profile of the apparatus, the angle of peel is also low and the cover sheet is removed without marring or damaging the image-defining surface. The leader is wrapped on roll 16 and the removed cover sheet 26 serves as a leader for the next film to be stripped. If, during operation, lever 20 is released inadvertently, spring 78 rotates shaft 32 relatively with respect to housing 30 and cuts off power to motor 60 before the housing opens. As many as twelve or fifteen cover sheets have been wrapped on roll 16 before removing them. In the preferred embodiment, the leader 14 has been cut from a roll of MYLAR ® polyester film and required replacement only when wrinkled or damaged.

What is claimed as new and desired to be secured by Letters Patent is:

1. An apparatus comprising:
   a support having a top surface on which a film including a cover sheet can be fixed in a stationary relationship with respect to a stripping roll;
   an elongated stripping roll mounted for rotation about an axis parallel to said top surface;
   a leader in the form of a thin sheet having opposed ends, one of said ends being attached to said roll, the other of said ends being adapted for attachment to an edge of a cover sheet remote from said roll; and
   drive means coupled to the roll for rotating said roll to apply an even, steady tension to said leader as said leader is wrapped thereon thereby stripping the cover sheet from a fixed film.

2. The apparatus of claim 1 wherein said drive means comprises a second roll mounted in parallelism with said stripping roll, one of said rolls being mounted for movement toward and away from a position in which the rolls are engaged, and a motor coupled to said second roll.

3. The apparatus of claim 1 wherein said drive means comprises a second roll mounted in parallelism with said stripping roll, the latter being mounted for swinging movement toward and away from a position of engagement with the second roll, and a motor coupled to said second roll.

4. The apparatus of claim 3 wherein said stripping roll is in the form of a hollow shell of thin, lightweight tubing.

5. The apparatus of claim 3 wherein is provided a lever for swinging the stripping roll, a cam associated with the lever and a switch coupled to said motor, said switch being positioned in the path of said cam to activate the motor before the rolls are engaged.

6. The apparatus of claim 5 wherein is provided a lost motion device coupling the lever to the stripping roll, thereby permitting limited movement of the lever and cam before the roll is swung.

* * * * *